(12) United States Patent
Hwang et al.

(10) Patent No.: US 12,287,064 B2
(45) Date of Patent: Apr. 29, 2025

(54) GAS CONTAINER AND DEPOSITION SYSTEM INCLUDING THE SAME

(71) Applicants: SK Specialty Co., Ltd., Yeongju-si (KR); SAMSUNG ELECTRONICS CO., LTD., Suwon-si (KR)

(72) Inventors: Sunhye Hwang, Hwaseong-si (KR); Wonwoong Chung, Incheon (KR); Younjoung Cho, Hwaseong-si (KR); Youngha Song, Cheonan-si (KR); Yonghun Shin, Yeongju-si (KR); Byungkil Lee, Yeongju-si (KR); Sungdo Lee, Yeongju-si (KR); Jinhee Lee, Suwon-si (KR)

(73) Assignees: Samsung Electronics Co., Ltd. (KR); SK Specialty Co., Ltd. (KR)

( * ) Notice: Subject to any disclaimer, the term of this patent is extended or adjusted under 35 U.S.C. 154(b) by 410 days.

(21) Appl. No.: 17/037,934

(22) Filed: Sep. 30, 2020

(65) Prior Publication Data
US 2021/0301388 A1   Sep. 30, 2021

(30) Foreign Application Priority Data
Mar. 25, 2020   (KR) .................. 10-2020-0036428

(51) Int. Cl.
| | | |
|---|---|---|
| C23C 14/24 | (2006.01) | |
| C23C 16/455 | (2006.01) | |
| F17C 1/00 | (2006.01) | |
| F17C 1/14 | (2006.01) | |

(52) U.S. Cl.
CPC .............. *F17C 1/14* (2013.01); *C23C 14/246* (2013.01); *C23C 16/45544* (2013.01); *C23C 16/45561* (2013.01); *F17C 1/005* (2013.01)

(58) Field of Classification Search
CPC .. F17C 1/005; C23C 14/246; C23C 16/45561
See application file for complete search history.

(56) References Cited

U.S. PATENT DOCUMENTS

| | | |
|---|---|---|
| 7,595,246 B2 | 9/2009 | Kang et al. |
| 8,485,361 B2 | 7/2013 | Rauleder et al. |
| 8,590,705 B2 | 11/2013 | Behm et al. |
| 9,085,062 B2 | 7/2015 | Holroyd et al. |
| 9,761,719 B2 | 9/2017 | Kim et al. |
| 2003/0131885 A1* | 7/2003 | Birtcher ............... B67D 7/0272 137/240 |

(Continued)

FOREIGN PATENT DOCUMENTS

| | | |
|---|---|---|
| JP | H 0666400 A | 3/1994 |
| JP | 2005-090651 A | 4/2005 |

(Continued)

OTHER PUBLICATIONS

Office Action in Korean Appln. No. 10-2020-0036428, mailed on Mar. 11, 2025, 19 pages (with English translation).

*Primary Examiner* — Joseph A Miller, Jr.
(74) *Attorney, Agent, or Firm* — Fish & Richardson P.C.

(57) ABSTRACT

A deposition system and a gas storage device, the deposition system including a process chamber; and a gas supply outside of the process chamber, the gas supply being configured to provide monochlorosilane, wherein the gas supply includes a cabinet; and a gas container inside the cabinet, and the gas container includes aluminum (Al).

11 Claims, 14 Drawing Sheets

(56) References Cited

U.S. PATENT DOCUMENTS

| | | | |
|---|---|---|---|
| 2004/0028569 A1* | 2/2004 | Zorich | C23C 16/4407 422/243 |
| 2009/0166625 A1 | 7/2009 | Ting et al. | |
| 2012/0103857 A1* | 5/2012 | Behm | C23C 16/448 451/28 |
| 2015/0184296 A1* | 7/2015 | Xu | C23C 16/4402 428/688 |
| 2016/0046408 A1* | 2/2016 | Girard | C23C 16/4481 427/236 |
| 2019/0309415 A1 | 10/2019 | Han et al. | |

FOREIGN PATENT DOCUMENTS

| | | |
|---|---|---|
| JP | 3705623 B2 | 10/2005 |
| JP | 4371747 B2 | 11/2009 |
| JP | 5412447 B2 | 2/2014 |
| KR | 10-2003-0044396 A | 6/2003 |
| KR | 10-2019-0117053 A | 10/2019 |

* cited by examiner

GAS CONTAINER AND DEPOSITION SYSTEM INCLUDING THE SAME

CROSS-REFERENCE TO RELATED APPLICATION

Korean Patent Application No. 10-2020-0036428, filed on Mar. 25, 2020, in the Korean Intellectual Property Office, and entitled: "Gas Container and Deposition System Comprising the Same," is incorporated by reference herein in its entirety.

BACKGROUND

1. Field

Embodiments relate to a gas container and a deposition system including the same.

2. Description of the Related Art

A thin film process may provide a material layer on a wafer to manufacture a semiconductor device. The thin film process may include a Physical Vapor Deposition (PVD) process and a Chemical Vapor Deposition (CVD) process.

SUMMARY

The embodiments may be realized by providing a deposition system including a process chamber; and a gas supply outside of the process chamber, the gas supply being configured to provide monochlorosilane, wherein the gas supply includes a cabinet; and a gas container inside the cabinet, and the gas container includes aluminum (Al).

The embodiments may be realized by providing a deposition system including a process chamber; and a gas supply outside the process chamber, the gas supply being configured to provide monochlorosilane, wherein the gas supply includes a cabinet; and a gas container inside the cabinet, the gas container includes aluminum (Al), and a height of an internal surface of the gas container is 10 nm to 1 μm.

The embodiments may be realized by providing a gas storage device comprising a gas container configured to store monochlorosilane, wherein the gas container includes aluminum (Al) in an amount of 89 wt % to 100 wt %, based on a total weight of metals at a surface of an internal space of the gas container, a height of an internal surface of the gas container is less than or equal to 1 μm, and the gas container further includes an oxide layer including Al on the internal surface of the gas container.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, a gas container and a deposition system including the same will be described.

Figure 1:
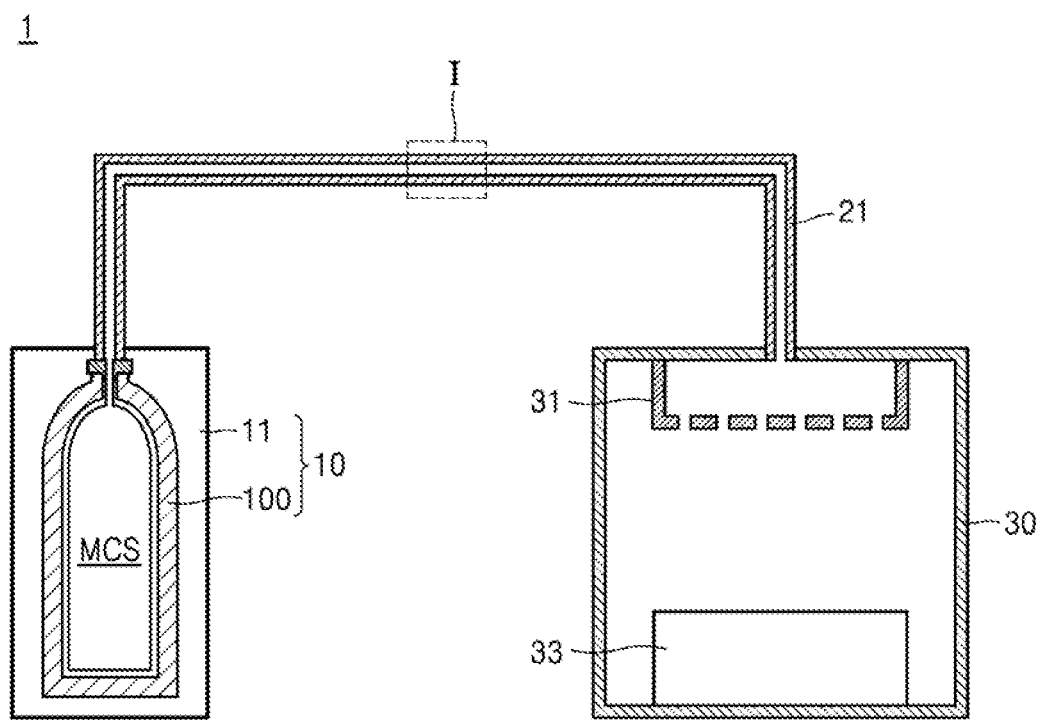
FIG. 1 is a schematic diagram of a deposition system according to embodiments.

FIG. 1 is a schematic diagram of a deposition system 1 according to embodiments.

Referring to FIG. 1, the deposition system 1 may include a process chamber 30, a first gas supply 10, and a first gas supply pipe 21. The process chamber 30 may have an internal space in which a deposition process is performable. The process chamber 30 may include a shower head 31 and a substrate support 33 therein.

The first gas supply 10 may be outside the process chamber 30, e.g., may be apart or separate from the process chamber 30. The first gas supply 10 may provide a first source gas to the internal space of the process chamber 30. The first source gas may be used in a thin film process in which a silicon-containing film is formed. In an implementation, the first source gas may include silicon. In an implementation, a silicon-containing gas may be monochlorosilane ($SiH_3Cl$) MCS. In descriptions below, the first source gas is monochlorosilane MCS.

The first gas supply 10 may include a cabinet 11 and a gas container 100. The gas container 100 may be in the cabinet 11. The gas container 100 may include monochlorosilane MCS therein. When a certain amount of monochlorosilane MCS in the gas container 100 is consumed, the gas container 100 may be replaced.

When a deposition process is performed using monochlorosilane MCS, the productivity of the deposition process may be improved compared to a deposition process using dichlorosilane ($SiH_2Cl_2$). In an implementation, a deposition rate and a yield of the deposition process using monochlorosilane MCS are greater than those of the deposition process using $SiH_2Cl_2$.

Monochlorosilane MCS may be relatively unstable, and monochlorosilane MCS may degrade faster than $SiH_2Cl_2$. Part of monochlorosilane MCS may be degraded in the gas container 100, and a by-product of the degradation (e.g., $SiH_4$) may be produced. As the deposition process proceeds, a concentration of monochlorosilane MCS in the gas container 100 may decrease, and an $SiH_4$ concentration increases. Thus, the purity of monochlorosilane MCS in the gas container 100 may decrease.

If the purity of monochlorosilane MCS falls below a certain value, the characteristics of a semiconductor device manufactured by using the relatively impure monochlorosilane MCS may be undesirably changed. The deposition system 1 according to embodiments may help maintain the purity of monochlorosilane MCS at a high level. Accordingly, the reliability of the deposition system 1 and a manufacturing method of a semiconductor device using the same may be improved.

Figure 2A:
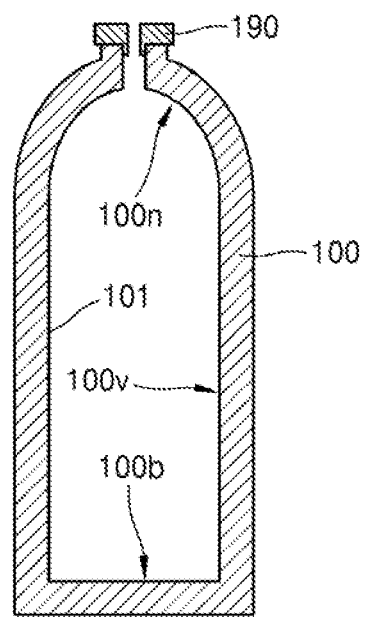
FIGS. 2A to 2F are diagrams of a gas storage method using a gas container, according to embodiments.
Figure 2B:
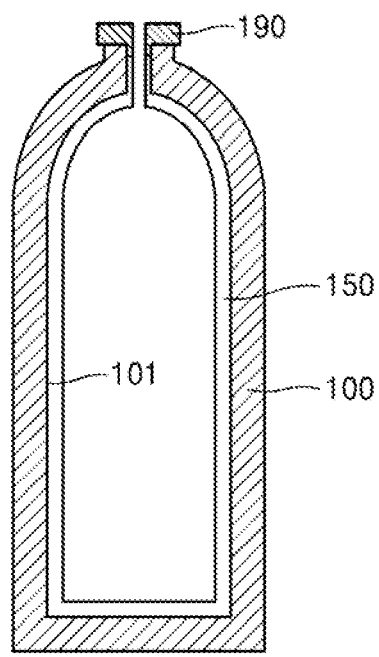
Figure 2C:
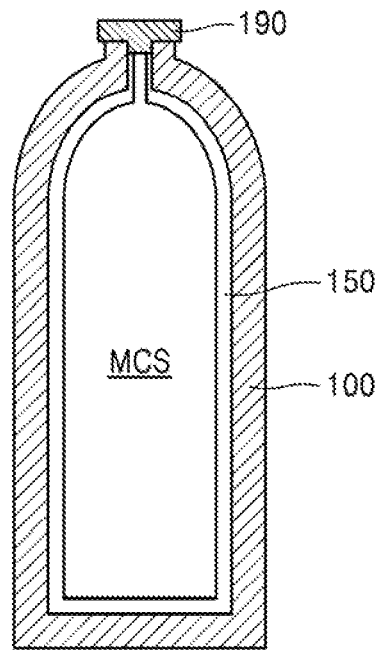

FIGS. 2A to 2C are cross-sectional views of a gas storage method using a gas container, according to embodiments.

Referring to FIG. 2A, the gas container 100 may be provided. The gas container 100 may include an internal space in which monochlorosilane MCS is storable. In an implementation, the gas container 100 may include aluminum (Al). In the present specification, the inclusion of Al may denote an inclusion of pure (e.g., non-compounded or non-alloyed) Al or an Al alloy. In an implementation, the gas container 100 may further include, e.g., iron (Fe), silicon (Si), copper (Cu), manganese (Mn), magnesium (Mg), chromium (Cr), zinc (Zn), titanium (Ti), or an alloy thereof. As used herein, the term "or" is not an exclusive term, e.g., "A or B" would include A, B, or A and B.

In an implementation, the gas container 100 may include Al in an amount of, e.g., about 89 wt % to about 100 wt %, based on a total weight of metals at a surface of an internal space of the gas container 100. In an implementation, the gas container 100 may include Al in an amount of, e.g., about 96 wt % or more (e.g., about 96 wt % to about 100 wt %). As described below with reference to FIG. 8, when the gas container 100 includes Al having the high mass ratio (e.g., equal to or greater than about 89 wt %), the degradation of monochlorosilane MCS stored in the gas container 100 may be reduced or prevented. Accordingly, the reliability of the gas container 100 and the deposition system 1 including the same may be improved.

The gas container 100 may include Fe in an amount of about 0 wt % to about 1.0 wt %. The gas container 100 may include Si in an amount of about 0 wt % to about 1.3 wt %. The gas container 100 may include Cu in an amount of about 0 wt % to about 0.4%. The gas container 100 may include Mn in an amount of about 0 wt % to about 1.5 wt %. The gas container 100 may include Mg in an amount of about 0 wt % to about 5 wt %. The gas container 100 may include Cr in an amount of about 0 wt % to about 0.4 wt %. The gas container 100 may include Zn in an amount of about 0 wt % to about 0.4 wt %. The gas container 100 may include Ti in an amount of about 0 wt % to about 0.2 wt %. Here, a 0 wt % inclusion of a certain material in the gas container 100 means that the material is not included, and a 100 wt % inclusion of a certain material in the gas container 100 means that the gas container 100 solely includes the certain material.

A polishing process may be performed on an internal surface 101 of the gas container 100. The polishing process may be performed to reduce a height (i.e., roughness) of the internal surface 101 of the gas container 100. In an implementation, the polishing process may include, e.g., mechanical polishing, chemical polishing, or mechano-chemical polishing.

In an implementation, the height (i.e., roughness) of the internal surface 101 of the gas container 100 (e.g., center line average height) may be less than or equal to 3 μm. In an implementation, the height of the internal surface 101 of the gas container 100, e.g., center line average height, may be less than or equal to 1 μm. In an implementation, the height of the internal surface 101 of the gas container 100 may be about 10 nm to about 1 μm. Here, the center line average height is a value obtained by dividing a sum of areas, which are offset from a centerline, by a length of a measurement area, based on a centerline corresponding to the average of heights in a height curve in the cross-section of the measurement area.

As described below with reference to FIG. 9, the degradation of monochlorosilane MCS stored in the gas container 100 may be reduced or prevented by setting the center line average height of the internal surface 101 of the gas container 100 to be less than or equal to 1 μm. Accordingly, the reliability of the gas container 100 and the deposition system including the gas container 100 may be improved.

In an implementation, the height may be uniform in the entire inner surface of the gas container 100. In an implementation, the height of the internal surface 101 of the gas container 100 may differ according to a location of the gas container 100. In an implementation, a neck part 100n of the gas container 100 may be at a higher level than a bottom surface 100b and a vertical side wall 100v. Here, the neck part 100n of the gas container 100 denotes a portion that is located around an inlet of the gas container 100 and has an internal space narrowing.

A valve 190 may be on the inlet of the gas container 100. An input/output of a material, e.g., $SiH_3Cl$ (MCS, see FIG. 1), which is stored in the gas container 100, through the valve 190 may be adjusted.

Referring to FIG. 2B, a passivation process may be performed to form a passivation layer 150 on the inside of the gas container 100. The passivation layer 150 may cover the internal surface 101 of the gas container 100. The passivation layer 150 may be provided on the internal surface 101 of the gas container 100.

The passivation process may include rolling the gas container 100 after a passivation material is provided in the gas container 100. In an implementation, the passivation material may include a material (e.g., $SiH_3Cl$) that is the same as a gas to be stored. The passivation layer 150 may include any one of $SiH_3Cl$ and derivatives of $SiH_3Cl$. In an implementation, the passivation layer 150 may be in a liquid state.

Referring to FIG. 2C, the internal space of the gas container 100 may be filled with monochlorosilane MCS. Monochlorosilane MCS may be provided onto the passivation layer 150. In an implementation, monochlorosilane MCS may be in a gas state. In an implementation, monochlorosilane MCS may be in a liquefied gas state. In an implementation, after monochlorosilane MCS is charged in the gas container 100, monochlorosilane MCS and the passivation layer 150 may form consecutive layers.

In an implementation, the passivation layer 150 may cover lower and upper portions of the internal surface 101 of the gas container 100, and a degradation reaction of monochlorosilane MCS may be reduced or prevented. Accordingly, although monochlorosilane MCS may be stored in the gas container 100 for a long period of time, the purity of monochlorosilane MCS may remain high.

The purity of monochlorosilane MCS may be, e.g., about 99.90 vol % to about 100 vol %. The higher the initial purity of monochlorosilane MCS provided in the gas container 100 is, the higher the purity of monochlorosilane MCS may remain even if monochlorosilane MCS is stored for a long time. After monochlorosilane MCS is charged in the gas container 100, the storage of monochlorosilane MCS may be completed by closing the valve 190.

In an implementation, the charging mass of monochlorosilane MCS and a volume ratio inside the gas container 100 may be equal to or greater than about 0.7 kg/L. In an implementation, the charging mass of monochlorosilane MCS and a volume ratio inside the gas container 100 may be equal to or greater than about 0.72 kg/L. In an implementation, the charging mass of monochlorosilane MCS and a volume ratio inside the gas container 100 may be equal to or less than about 0.8 kg/L. In an implementation, the charging mass of monochlorosilane MCS and a volume ratio inside the gas container 100 may be equal to or less than about 0.75 kg/L.

In an implementation, the concentration of monochlorosilane MCS in the gas container 100 may remain high by setting the charging mass of monochlorosilane MCS and the volume ratio inside the gas container 100 to be equal to or greater than 0.7 kg/L, and damage to the gas container 100 may be prevented by setting the charging mass of monochlorosilane MCS and the volume ratio inside the gas container 100 not to be seriously or excessively high.

In an implementation, the purity of monochlorosilane MCS in the gas container 100 may remain relatively high as described below, e.g., when the charging mass of monochlorosilane MCS and the volume ratio inside the gas container 100 are set to be equal to or greater than 0.7 kg/L. In an implementation, damage to the gas container 100 (e.g., damage due to severe pressure increase) may be prevented, e.g., when the charging mass of monochlorosilane MCS and the volume ratio inside the gas container 100 are set to be equal to or less than 0.8 kg/L.

Here, the effects of the gas container 100 according to embodiments will be described with reference to FIGS. 8 to 10.

Figure 8:
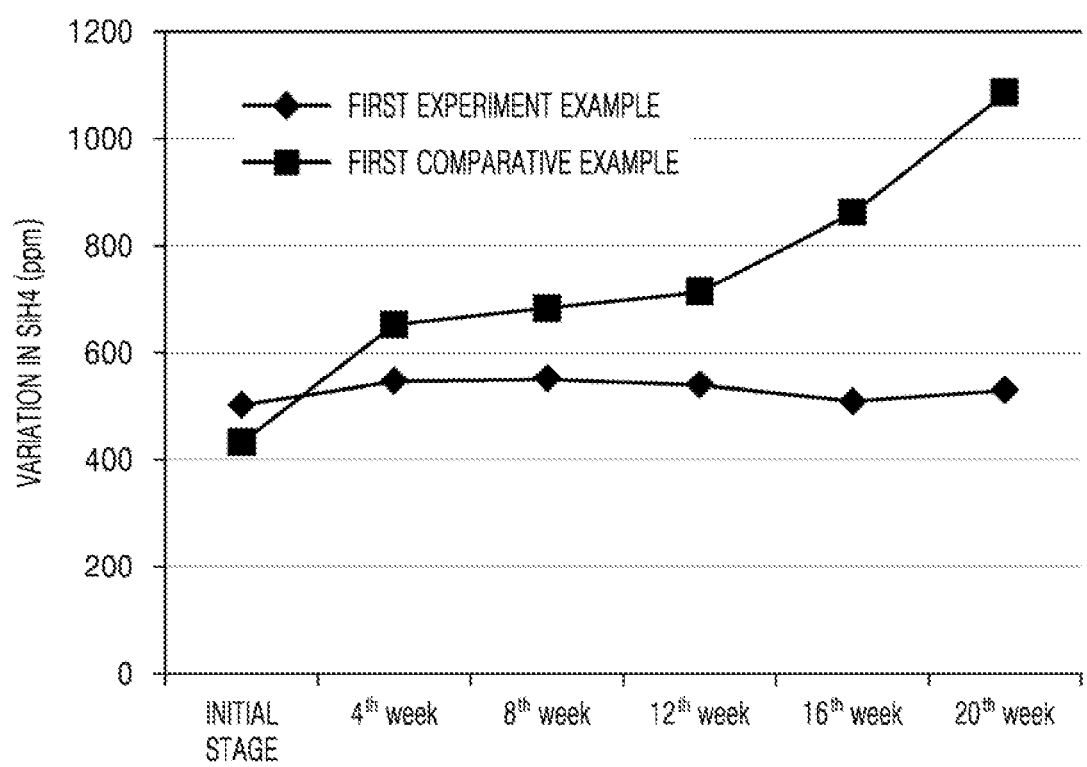
FIGS. 8 to 10 are graphs showing effects according to embodiments.
Figure 9:
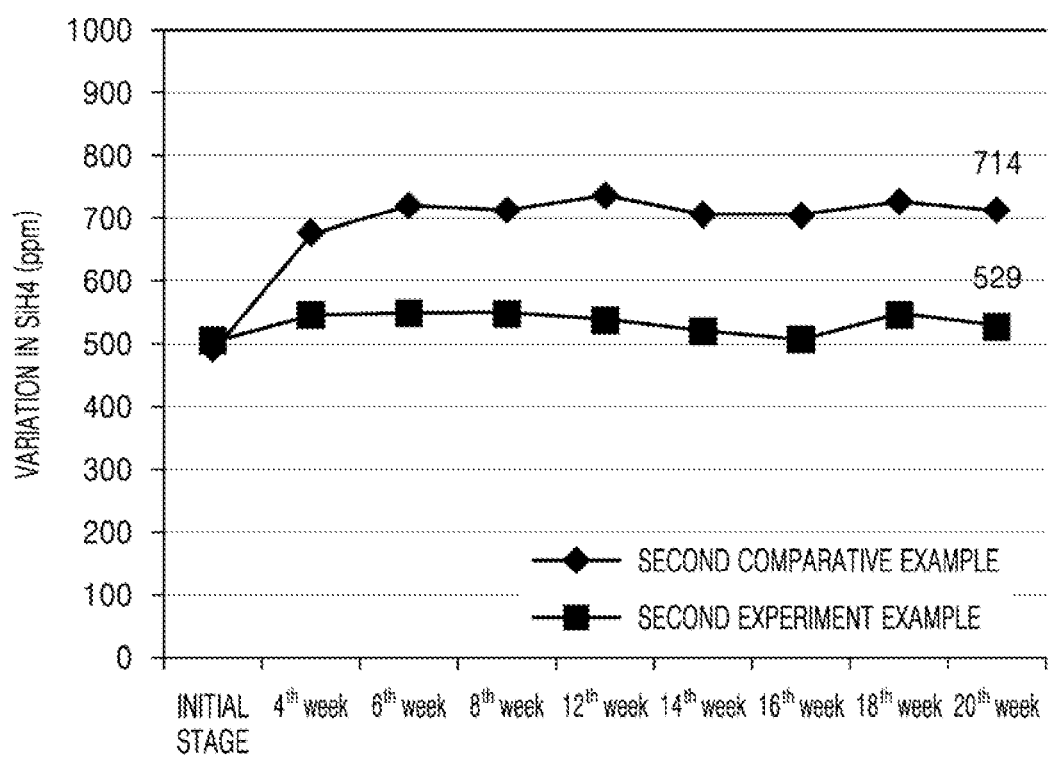
Figure 10:
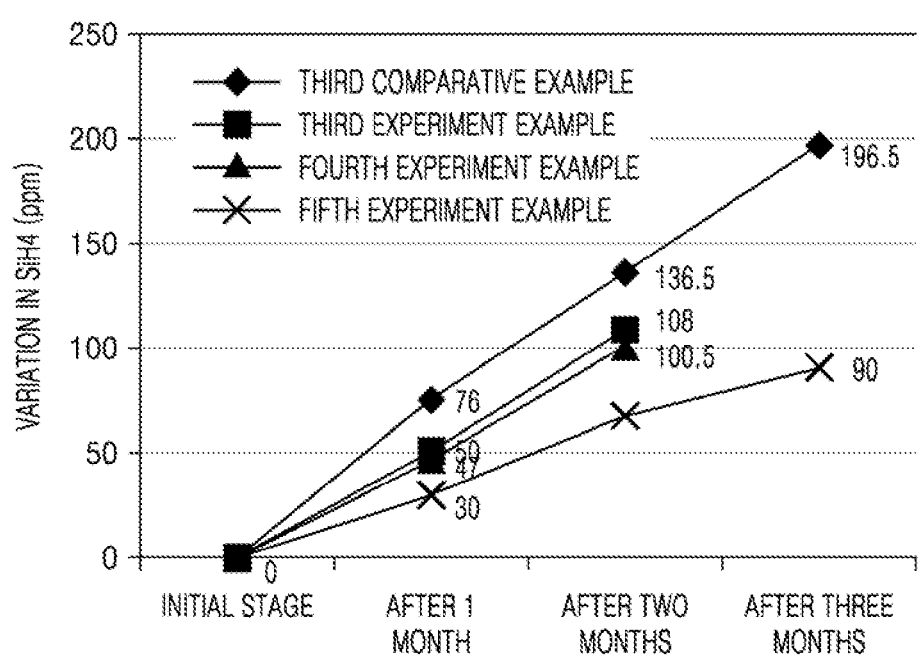

FIGS. 8 to 10 are graphs showing the effects of the gas container (100, referring to FIG. 2C), according to embodiments.

Referring to FIG. 8, as time passed, a $SiH_4$ concentration changed in a gas container of the first experiment example and the first comparative example. The gas container of the first experiment example included Al, and the gas container of the first comparative example included Mn. In more detail, the gas container of the first comparative example included Fe about 80% or more and Mn about 5% or more, and a composition of gas container of the first experiment example was the same as that of the gas container 100 described with reference to FIG. 2. After monochlorosilane MCS was charged respectively in the gas containers of the first experiment example and the first comparative example, a variation in the $SiH_4$ concentration over 20 weeks was measured at ambient temperature. As shown in Table 1, below, the Increment indicates a difference between the $SiH_4$ concentration at an initial stage in each gas container and the $SiH_4$ concentration in each gas container after 20 weeks. Numbers of Table 1 are in units of parts-per-million (ppm).

Referring to FIG. 8, the $SiH_4$ concentration in the gas container of the first comparative example increased by 151.4%, whereas the $SiH_4$ concentration in the gas container of the first experiment example increased by only 5.2%. Thus, the variation substantially remained constant. Table 1 shows the variation in the $SiH_4$ concentration in each gas container according to elapsed time.

purity of $SiH_3Cl$ (MCS, see FIG. 1) in the gas container (100, see FIG. 1) may remain high. In an implementation, the degradation reaction of $SiH_3Cl$ stored in an Al container may be prevented or reduced at ambient temperature, and $SiH_3Cl$ may be stably stored at ambient temperature. Accordingly, $SiH_3Cl$ having high purity may be provided from the gas container to a process chamber, and the reliability of the semiconductor device may be improved.

Referring to FIG. 9, as time passed, the $SiH_4$ concentration changed in a gas container of a second experiment example and a second comparative example. A height value (i.e., roughness) of an internal surface of the gas container of the second experiment example was less than a height value of an internal surface of the gas container of the second comparative example. The height value of the internal surface of the gas container of the second comparative example was about 3 μm, and the height value of the internal surface of the gas container of the second experiment example was about 1 μm.

After $SiH_3Cl$ was charged respectively in the gas containers of the second experiment example and the second comparative example, a variation in $SiH_4$ concentration for 20 weeks was measured at ambient temperature. As a result, it may be seen that an increment in the $SiH_4$ concentration was reduced as shown in the second experiment example in which the height of the internal surface of the gas container were smaller compared to the second comparative example.

The degradation reaction of $SiH_3Cl$ may mainly occur in or on a surface on which the gas container contacts $SiH_3Cl$. In an implementation, the height of the internal surface of the gas container may be less than or equal to 1 μm, and the concentration of $SiH_3Cl$ may remain high.

Referring to FIGS. 2A and 10, based on the third comparative example, the third and fifth experiment examples show the effect of an increase in a charging amount in the gas container 100, and the fourth and fifth experiment examples show the effect of improvement in a polishing method performed on the internal surface 101 of the gas container 100.

Details regarding third comparative example and the third to fifth experiment examples are shown in Table 2 below. A charging amount is presented as (mass of $SiH_3Cl$)/(the volume of the gas container) in Table 2. A gradient polishing method indicates that polishing was performed on the internal surface by tilting the gas container 100, and a vertical

TABLE 1

| | Initial stage | Fourth week | Eighth week | Twelfth week | Sixteenth week | Twentieth week | Increment |
| --- | --- | --- | --- | --- | --- | --- | --- |
| First experiment example | 503 | 546 | 550 | 539 | 508 | 529 | 26 |
| First comparative example | 432 | 653 | 682 | 714 | 861 | 1086 | 654 |

Referring to Table 1, an increment in the $SiH_4$ concentration in the gas container of the first experiment example after 20 weeks was less than or equal to about 4% of an increment in the $SiH_4$ concentration in the gas container of the first comparative example after 20 weeks.

In an implementation, the gas container (100, see FIG. 1) may have a high Al content, the degradation reaction of $SiH_3Cl$ (MCS, see FIG. 1) may be reduced, and thus, the polishing method indicates that polishing was performed by making the gas container 100 be vertical to the ground. In the case of gradient polishing, the bottom surface 100b, the vertical side wall 100v, and the neck part 100n of the gas container 100 may be polished. In the case of vertical polishing, the bottom surface 100b and the vertical side wall 100v of the gas container 100 may be polished, but the neck part 100n thereof may not be polished.

TABLE 2

| | Charging amount (kg/L) | Polishing method | SiH$_4$ concentration as time passes | | | Improvement rate for two months |
|---|---|---|---|---|---|---|
| | | | First month | Second month | Third month | |
| Third comparative example | 0.55 | Vertical polishing | 69 ppm | 136.5 ppm | 196.5 ppm | |
| Third experiment example | 0.72 | Vertical polishing | 46 ppm | 108 ppm | | 20% |
| Fourth experiment example | 0.55 | Gradient polishing | 50 ppm | 100.5 ppm | | 26% |
| Fifth experiment example | 0.72 | Gradient polishing | 33 ppm | 67.5 ppm | 90 ppm | 51% |

As a result of the experiment, an SiH$_4$ concentration in the third experiment example was 20% better than the third comparative example after two months, an SiH$_4$ concentration in the fourth experiment example was 26% better than the third comparative example after two months, and an SiH$_4$ concentration in the fifth experiment example was 51% better than the third comparative example after two months. In an implementation, the purity of SiH$_3$Cl may remain high by increasing the charging amount of SiH$_3$Cl in the gas container.

Figure 2D:
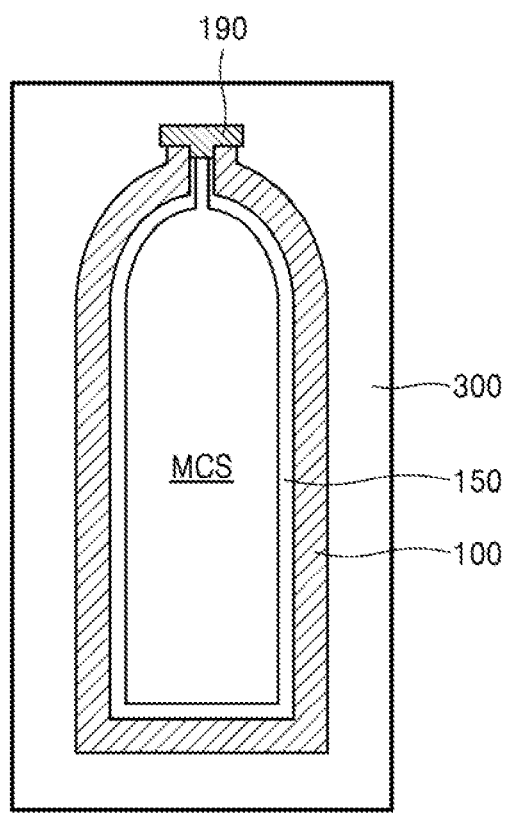

FIG. 2D is a diagram of a storage method of a gas container according to embodiments. Hereinafter, the descriptions that are already provided will not be repeated.

Referring to FIG. 2D, the gas container 100 may be stored in a storage housing 300. Here, according to the method described with reference to FIGS. 2A to 2C, the gas container 100, in which monochlorosilane MCS may be stored, may be provided or accommodated in the storage housing 300. In an implementation, a gas container 100' of FIG. 2E or a gas container 100" of FIG. 2F may be provided in the storage housing 300.

The storage housing 300 may be a housing of a storage storing therein the gas container 100, in which charging of monochlorosilane MCS may be completed, or a housing included in a transfer device when the gas container 100 is transferred. When the gas container 100 is kept at a high temperature, a reaction rate of the degradation reaction of monochlorosilane MCS may increase. An internal temperature of the storage housing 300 may be set to be about −45° C. to about 30° C. The degradation reaction of monochlorosilane MCS may be prevented or reduced under the above temperature condition, the purity of monochlorosilane MCS may remain high in the gas container 100.

In an implementation, the storage housing 300 may further include a temperature adjuster in the storage housing 300. The temperature adjuster may set and adjust the internal temperature of the storage housing 300. In an implementation, the temperature adjuster may be outside of the storage housing 300. An internal purity of monochlorosilane MCS may be maintained between about 99.90 vol % and about 100 vol % by the storage housing 300 and the gas container 100.

Figure 2E:
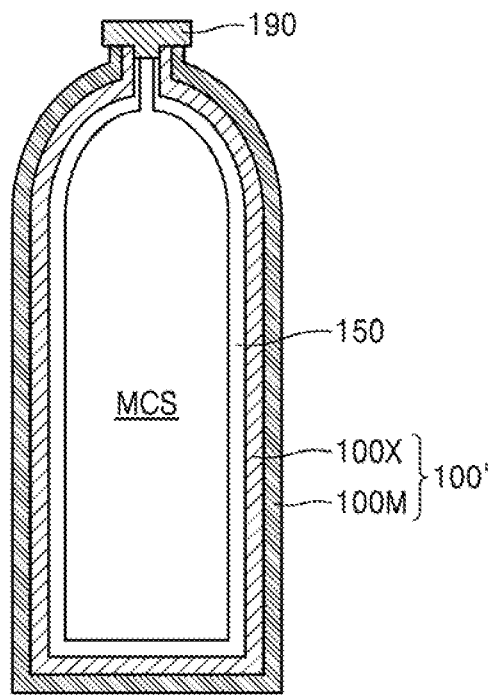

FIG. 2E is a cross-sectional view of the gas container 100' according to other embodiments. For convenience, the descriptions that are already provided with reference to FIGS. 2A to 2C may not be repeated, and a difference will be mainly described.

Referring to FIG. 2E, the gas container 100' may include a metal layer 100M and a metal oxide layer 100X. The metal oxide layer 100X may be formed through oxidation of a metal material (e.g., Al) included in the metal layer 100M. In an implementation, the metal layer 100M may be similar to the gas container described with reference to FIG. 2A. In an implementation, a mass ratio or amount of Al among metals included in the gas container 100' may be about 89 wt % to about 100 wt %. In an implementation, the mass ratio of Al among metals included in the gas container 100' may be equal to or greater than 96 wt %.

In an implementation, the metal oxide layer 100X may be formed according to natural or artificial oxidation processes. When the metal oxide layer 100X is naturally formed, a thickness of the metal oxide layer 100X may be several angstroms (Å) to several μm. When the metal oxide layer 100X is artificially formed, the thickness of the metal oxide layer 100X may be several Å to several hundred μm.

The passivation layer 150 may be on an internal surface of the metal oxide layer 100X. The passivation layer 150 may be substantially the same as that described above with reference to FIGS. 2B and 2C.

Figure 2F:
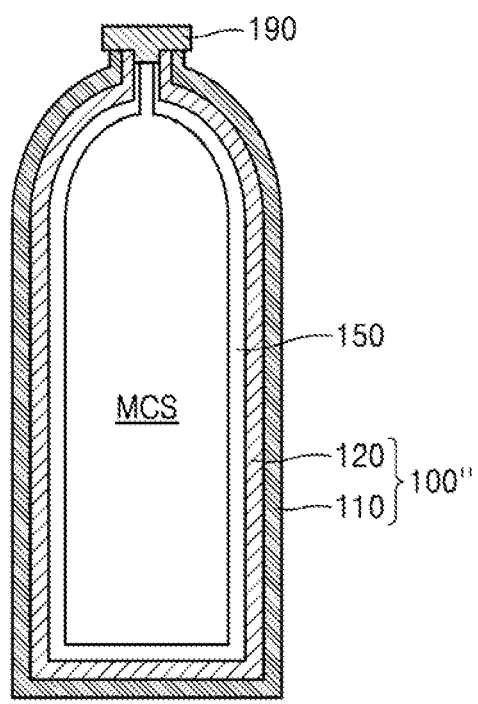

FIG. 2F is a cross-sectional view of the gas container 100" according to other embodiments. For convenience of explanation, the descriptions provided with reference to FIGS. 2A to 2C may not be repeated, and a difference will mainly be described.

Referring to FIG. 2F, monochlorosilane MCS may be stored in the gas container 100". The gas container 100" may include an external container 110 and a coating layer 120. The coating layer 120 may cover an internal surface of the external container 110. In an implementation, the coating layer 120 may be formed by coating the internal surface of the external container 110 with a metal material.

The coating layer 120 may include Al. An Al content in the coating layer 120 may be about 89 wt % to about 100 wt %. The coating layer 120 may include Al in an amount of about 89 wt % or more, and the degradation reaction of monochlorosilane MCS may be prevented/reduced. In an implementation, the coating layer 120 may further include, e.g., Fe, Si, Cu, Mn, Mg, Cr, Zn, Ti, or an alloy thereof, in addition to Al.

In an implementation, the external container 110 may include Al, carbon steel, chromium-cobalt (Co) steel, or stainless steel. In an implementation, the external container 110 may include nickel (Ni), Co, brass, Cu, or an alloy thereof. The coating layer 120 may have a higher Al content than the external container 110. In an implementation, an oxide layer may be further formed on an internal surface of the coating layer 120.

The passivation layer 150 may be on the internal surface of the coating layer 120. The passivation layer 150 may be the same as that described above with reference to FIGS. 2B and 2C.

Referring back to FIG. 1, the gas container 100, in which monochlorosilane MCS may be charged according to a series of processes described with reference to FIGS. 2A to 2D, may be mounted on or in a cabinet 11 of the first gas supply 10. The gas container 100 may be stored in the storage housing 300 (described with reference to FIG. 2D), and then may be transferred to the cabinet 11 from the storage housing 300 to perform a deposition process. The cabinet 11 may surround the gas container 100.

In an implementation, the cabinet 11 may further include a temperature adjuster. When the cabinet 11 includes the temperature adjuster, the temperature adjuster may be integrally formed with or in the cabinet 11. The temperature adjuster may include a cooling device such as a chiller. The temperature adjuster may adjust the internal temperature of the cabinet 11 to facilitate the internal temperature to be in a set range (e.g., between about −45° C. and about 30° C.). Accordingly, as described below, while a silicon-containing film is formed, monochlorosilane MCS having the high purity (e.g., the purity between about 99.90 vol % and about 100 vol %) may be provided to the process chamber 30 (e.g., the monochlorosilane MCS in the gas container 100 may be maintained at the above-described temperature to maintain high purity).

An internal space of the first gas supply pipe 21 may be connected to each of the internal space of the gas container 100 and the internal space of the process chamber 30. Accordingly, monochlorosilane MCS from the gas container 100 may be provided to the process chamber 30 through the first gas supply pipe 21. Hereinafter, the first gas supply pipe 21 will be described in more detail.

FIGS. 3A to 3D are cross-sectional views showing an enlarged I area of FIG. 1. Hereinafter, the descriptions already provided above may not be repeated, and FIG. 1 will also be referred to for descriptions.

Figure 3A:
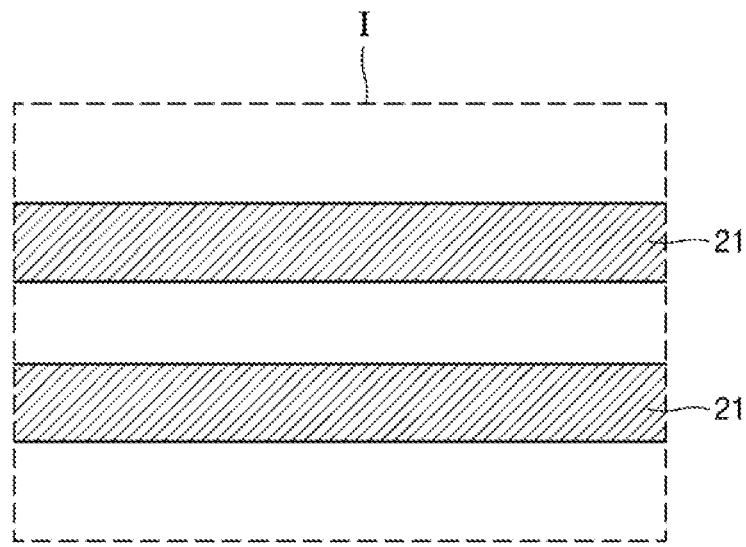
FIGS. 3A to 3D are diagrams of a first gas supply pipe according to embodiments.
Figure 3B:
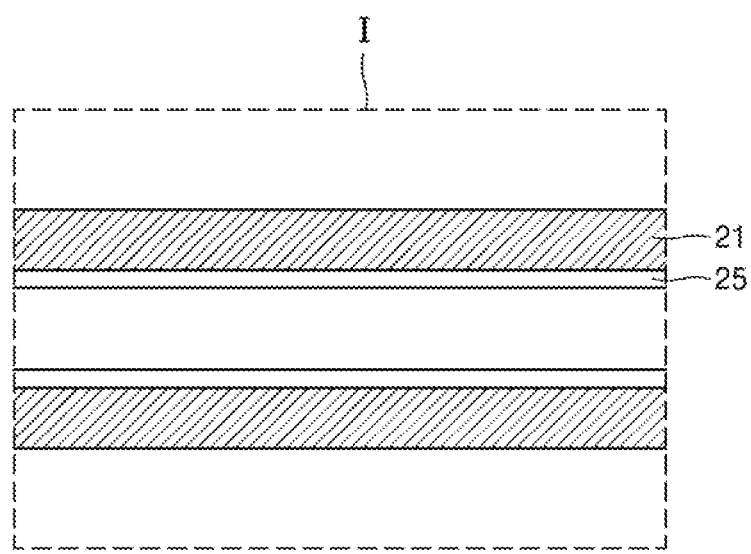
Figure 3C:
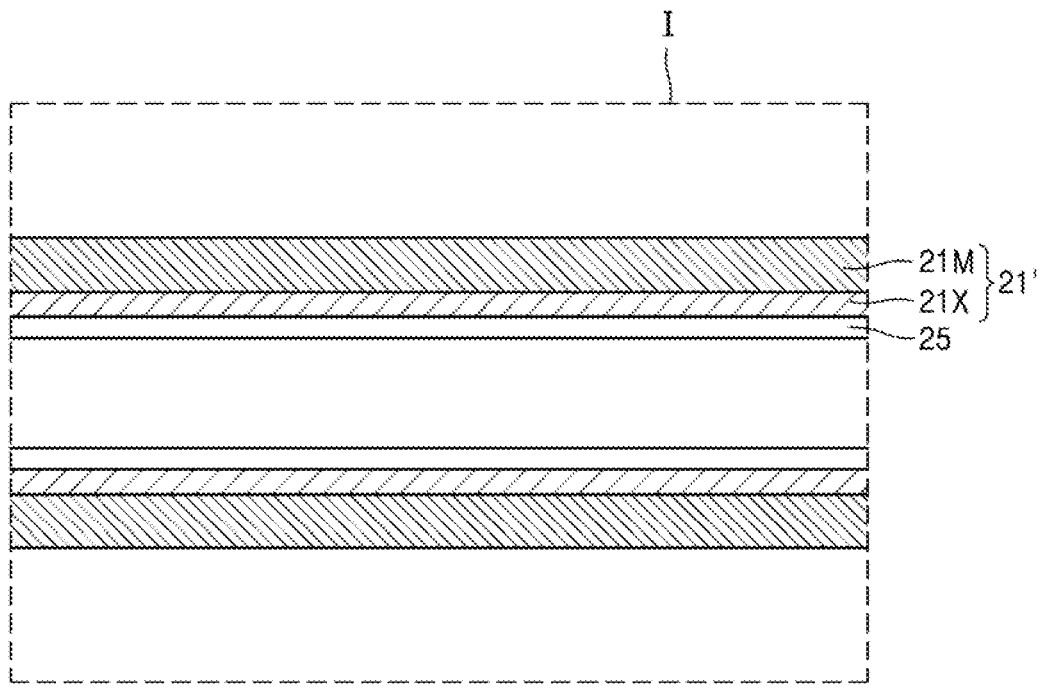

Referring to FIGS. 3A, 3B, and 3C, the first gas supply pipe 21 may have an internal space. The internal space of the first gas supply pipe 21 may be provided as a path in which the first source gas (e.g., monochlorosilane MCS) is flowable.

Referring to FIGS. 3A and 3B, the first gas supply pipe 21 may include Al. In an implementation, the first gas supply pipe 21 may include an Al alloy. In an implementation, the first gas supply pipe 21 may have substantially the same composition as the gas container 100 described with reference to FIG. 2A. Accordingly, the degradation of monochlorosilane MCS in the first gas supply pipe 21 may be prevented or reduced. In an implementation, the first gas supply pipe 21 may have a composition (e.g., a lower mass ratio of Al) that is different from that of the gas container 100 described with reference to FIG. 2A.

In an implementation, the roughness of the internal surface of the first gas supply pipe 21 may differ from the height (i.e., roughness) of the internal surface of the gas container 100 of FIG. 1. In an implementation, the roughness of the internal surface of the first gas supply pipe 21 may be greater than the height (i.e., roughness) of the internal surface of the gas container 100 of FIG. 1.

In an implementation, as shown in FIG. 3B, a path passivation layer 25 may be further provided on the internal surface of the first gas supply pipe 21. The path passivation layer 25 may be on the internal surface of the first gas supply pipe 21. In an implementation, the path passivation layer 25 may include monochlorosilane MCS and derivatives of monochlorosilane MCS. The path passivation layer 25 may be in a liquid state. As the path passivation layer 25 is formed on the internal surface of the first gas supply pipe 21, monochlorosilane MCS having high purity (e.g., between about 99.90 vol % and about 100 vol %) may be provided to the process chamber 30.

FIG. 3C is a cross-sectional view of a first gas supply pipe 21' according to embodiments. For convenience of explanation, the descriptions provided with reference to FIGS. 3A and 3B may not be repeated, and a difference will mainly be described.

Referring to FIG. 3C, the first gas supply pipe 21' may include a metal layer 21M and a metal oxide layer 21X. In an implementation, a composition of the metal layer 21M may be substantially the same as that of the first gas supply pipe 21 described with reference to FIG. 3A. The metal oxide layer 21X may be an oxide layer including the metal material (e.g., Al) included in the metal layer 21M.

In an implementation, the mass ratio of Al among the metals included in the first gas supply pipe 21' may be about 89 wt % to about 100 wt %. In an implementation, the mass ratio or amount of Al among the metals included in the first gas supply pipe 21' may be equal to or greater than 96 wt %.

In an implementation, the metal oxide layer 21X may be formed through natural or artificial oxidation processes. When the metal oxide layer 21X is naturally formed, the thickness of the metal oxide layer 21X may be several Å to several μm. When the metal oxide layer 21X is artificially formed, the thickness of the metal oxide layer 21X may be several Å to several hundred μm.

The path passivation layer 25 may be provided on the internal surface of the metal oxide layer 21X. The path passivation layer 25 may be substantially the same as that described with reference to FIG. 3B.

Figure 3D:
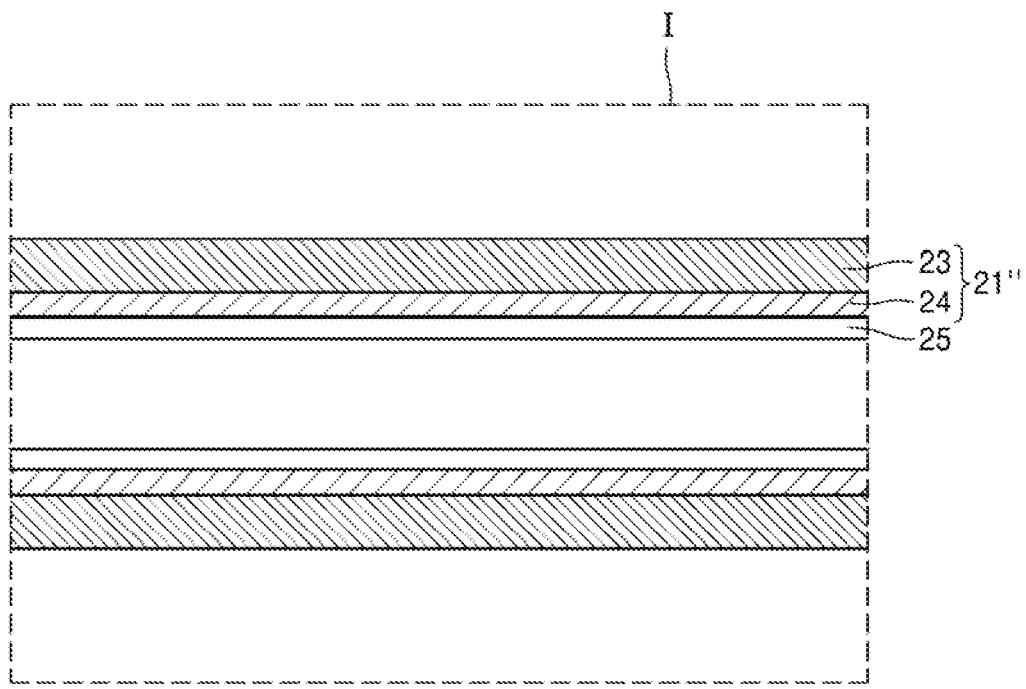

Referring to FIG. 3D, the first gas supply pipe 21" may include a coating layer 24 and an external pipe 23. The coating layer 24 may be formed by coating an internal wall of the external pipe 23 with a metal material. A composition of the external pipe 23 is similar to that of the external container 110 of FIG. 2F. A composition of the coating layer 24 is similar to that of the coating layer 120 of FIG. 2F. In an implementation, an oxide layer formed through partial oxidation of the coating layer 24 may be provided on the coating layer 24, similarly to the metal oxide layer 21X of FIG. 3C.

The path passivation layer 25 may cover the internal surface of the first gas supply pipe 21" (e.g., the internal surface of the coating layer 24). In an implementation, the path passivation layer 25 may be omitted.

Figure 4A:
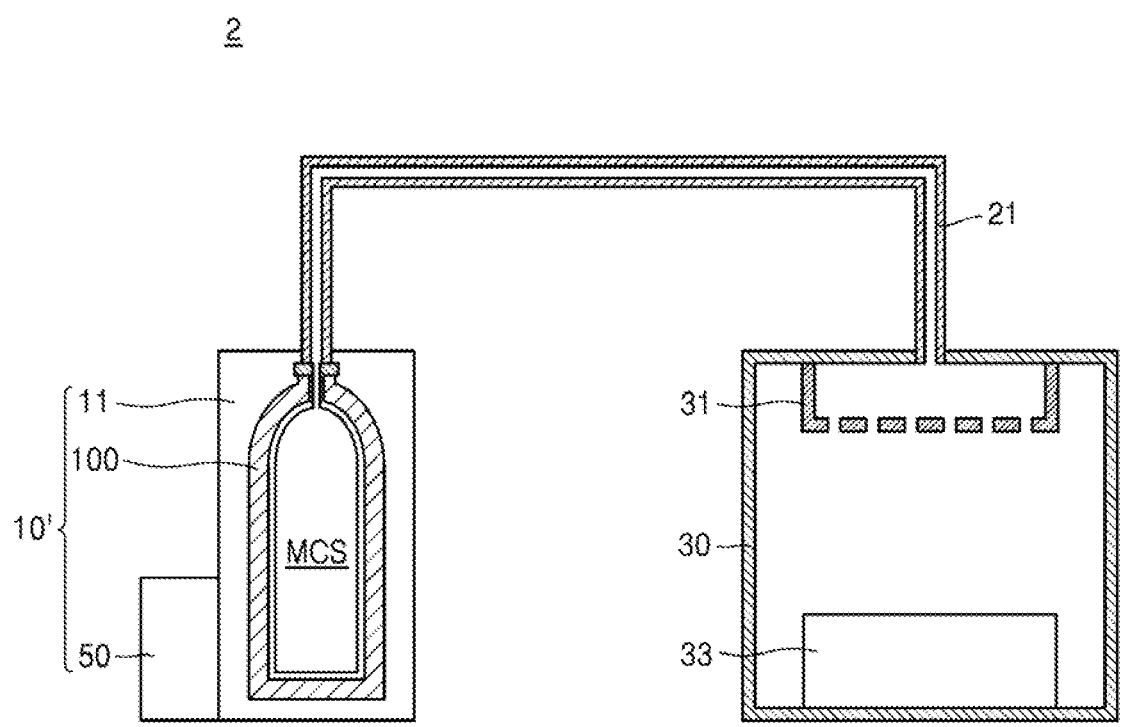
FIGS. 4A and 4B are diagrams of a deposition system according to embodiments.

FIG. 4A is a schematic diagram of a deposition system 2 according to embodiments. Hereinafter, the descriptions already provided may not be repeated.

Referring to FIG. 4A, the deposition system 2 may include the process chamber 30, a first gas supply 10', and the first gas supply pipe 21. The process chamber 30 and the first gas supply pipe 21 may be substantially the same as those described with reference to FIGS. 1 to 3C.

The first gas supply 10' may include the cabinet 11 and a temperature adjuster 50. Unlike FIG. 1, the temperature adjuster 50 may be separately provided on the outside of the cabinet 11. The temperature adjuster 50 may adjust an internal temperature of the cabinet 11 to be about −45° C. to about 30° C. (e.g., to maintain the monochlorosilane MCS in the gas container 100 at the above-described temperature). In an implementation, the temperature adjuster 50 may be a cooling device such as a chiller.

Figure 4B:
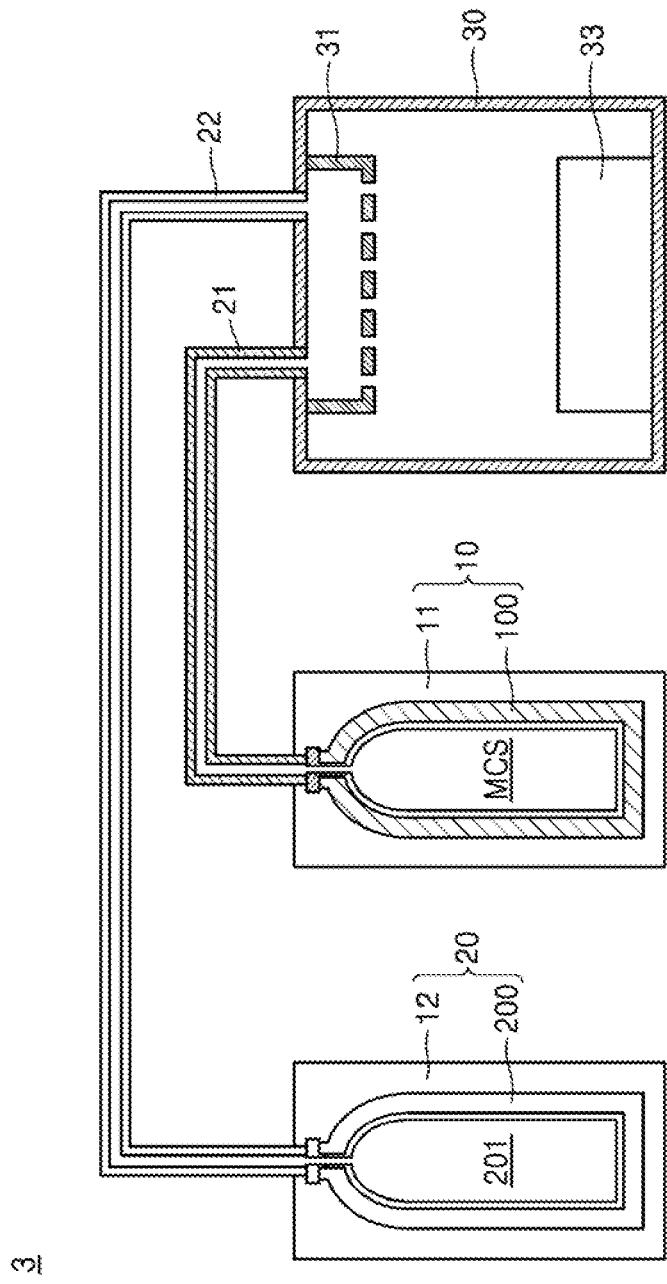

FIG. 4B is a schematic diagram of a deposition system according to embodiments. Hereinafter, the descriptions already provided will not be repeated.

Referring to FIG. 4B, a deposition system 3 may include the process chamber 30, the first gas supply 10, and the first gas supply pipe 21. In an implementation, the deposition system 3 may further include a second gas supply 20 and a second gas supply pipe 22. The process chamber 30, the first gas supply 10, and the first gas supply pipe 21 may be substantially the same as those described with reference to FIGS. 1 to 3C. In an implementation, the cabinet 11 may be integrally formed with a temperature adjuster therein.

The second gas supply 20 may be outside of the process chamber 30. The second gas supply 20 may include a cabinet 12. The cabinet 12 may include therein a storage container 200 in which a second source gas 201 is storable. The storage container 200 may be mounted on or in the cabinet 12 while a second source gas 201 is stored. When a certain amount of the second source gas 201 is consumed in the storage container 200, the storage container 200 may be replaced.

The second gas supply pipe 22 may be connected to each of the second gas supply 20 and the process chamber 30. The second gas supply 20 may supply the second source gas 201 to the process chamber 30 through the second gas supply pipe 22. In an implementation, the second source gas 201 may be different from monochlorosilane MCS. In an implementation, the second source gas 201 may include, e.g., an organic metal compound including germanium (Ge), a nitrogen (N) compound, or a N and oxygen (O) compound.

In an implementation, an additional gas supply may be further provided outside of the process chamber 30. The additional gas supply may provide an additional source gas to the process chamber 30, and the additional source gas may be different from monochlorosilane MCS and the second source gas 201.

Hereinafter, a formation method of a silicon-containing film and a manufacturing method of a semiconductor device according to embodiments will be described.

Figure 5:
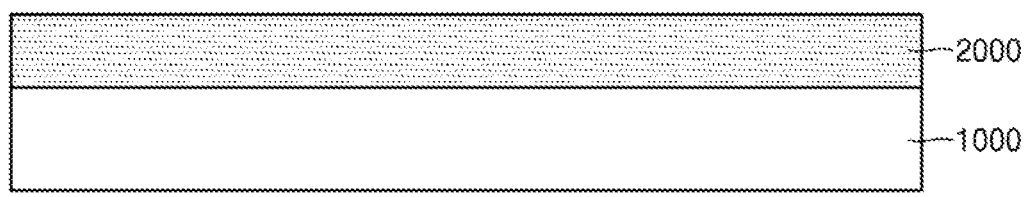
FIG. 5 is a diagram of a formation process of a silicon-containing film, according to embodiments.

FIG. 5 is a diagram of formation processes of the silicon-containing film, according to embodiments.

Referring to FIGS. 1 and 5, a silicon-containing film 2000 may be formed on a substrate 1000 by using the deposition system 1. In an implementation, the substrate 1000 may be loaded on an upper surface of a substrate support 33 to perform the deposition process. In an implementation, the substrate 1000 may be loaded on the substrate support 33 of any one of the deposition systems 2 and 3 of FIGS. 4A and 4B. The substrate 1000 may be a semiconductor wafer. Monochlorosilane MCS may be sprayed from the first gas supply pipe 21 to the process chamber 30 through the shower head 31.

As shown in FIG. 5, the silicon-containing film 2000 may be formed on the substrate 1000 by using monochlorosilane MCS. The silicon-containing film 2000 may be formed through the deposition process. The deposition process may be, e.g., an epitaxial growth process, a CVD process, a PVD process, or an atomic layer deposition process. An epitaxial process may include a selective epitaxial growth process. The CVD process may include a plasma enhanced CVD process.

In an implementation, based on the silicon-containing film 2000, source/drain patterns of the semiconductor device, a gate insulating layer, a spacer of a contact plug, or a liner layer may be formed. In an implementation, the silicon-containing film 2000 may be a gap-fill layer that fills a gap between components of the semiconductor device. In an implementation, the silicon-containing film 2000 may be a mask pattern used in semiconductor device manufacturing processes.

In an implementation, the silicon-containing film 2000 may include Si—Ge, silicon oxide, or silicon nitride. In this case, the silicon-containing film 2000 may be formed by the deposition system 3 of FIG. 4B.

The silicon-containing film 2000 may be formed through the deposition process using monochlorosilane MCS and the second source gas 201. The second source gas 201 may be provided to the process chamber 30 through the second gas supply pipe 22. Depending on a material of the silicon-containing film 2000 to be deposited, the second source gas 201 may be selected. The second source gas 201 may be a Ge-containing gas, a N-containing gas, or an O-containing gas. In an implementation, the silicon-containing film 2000 may be formed by using monochlorosilane MCS, and the silicon-containing film 2000 may be formed faster than a silicon-containing film formed by using $SiH_2Cl_2$.

Layers or patterns may be further formed between the substrate 1000 and the silicon-containing film 2000. Shapes of the silicon-containing film 2000 may vary.

Figure 6:
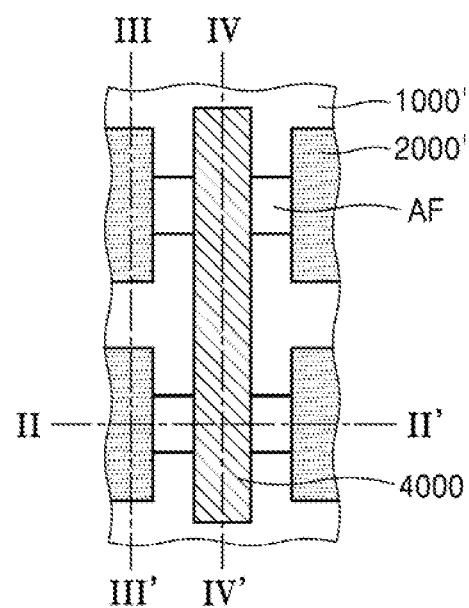
FIG. 6 is a plan view of a semiconductor device according to embodiments.

FIG. 6 is a plan view of a semiconductor device manufactured by using the deposition system 1, according to embodiments. FIGS. 7A to 7D are diagrams of stages in a manufacturing method of a semiconductor device by using the deposition system 1 according to some embodiments and sequentially correspond to cross-sections taken along lines II-II', III-III', and IV-IV' of FIG. 6. Hereinafter, the descriptions that are already provided may not be repeated.

Figure 7A:
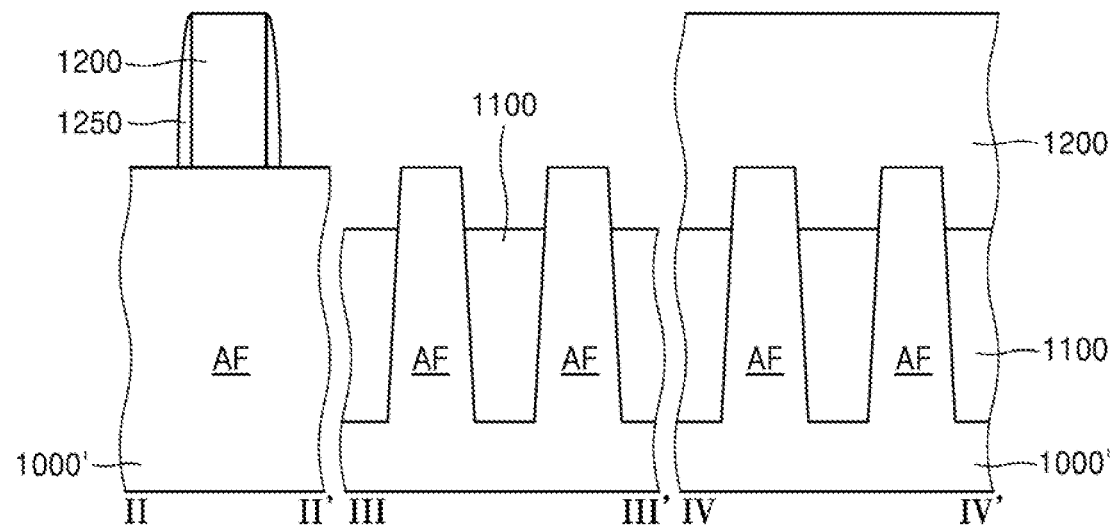
FIGS. 7A to 7D are diagrams of stages in a manufacturing method of a semiconductor device, according to embodiments.

Referring to FIGS. 6 and 7A, an active pattern AF protruding from a semiconductor substrate 1000' may be formed. The active pattern AF may extend in a first direction D1 as shown in FIG. 6. In this case, the first direction D1 may be parallel to a bottom surface of the semiconductor substrate 1000'. The semiconductor substrate 1000' may be, e.g., a Si substrate, a Ge substrate, a Si—Ge substrate, or an epitaxial substrate. After a mask layer is formed on the semiconductor substrate 1000', the semiconductor substrate 1000' may be etched by using the mask layer as an etch mask, thereby forming the active pattern AF.

A device separation pattern 1100 may be formed on the semiconductor substrate 1000' and thus may cover lower portions of sidewalls of the active pattern AF. An upper portion of the active pattern AF may not be covered by the device separation pattern 1100 and thus may be exposed to the outside. The device separation pattern 1100 may be formed through a Shallow Trench Isolation (STI) process. The device separation pattern 1100 may be a high-density plasma oxide layer, a Spin On Glass (SOG) Layer, or an oxide layer formed through CVD.

A sacrificial gate pattern 1200 may be formed on the semiconductor substrate 1000'. The sacrificial gate pattern 1200 may extend in a second direction D2 across the active pattern AF. In this case, the second direction D2 may be parallel to a bottom surface of the semiconductor substrate 1000' and may cross the first direction D1. The sacrificial gate pattern 1200 may cover a portion of the active pattern AF, but may expose another portion thereof. The sacrificial gate pattern 1200 may include polysilicon.

A spacer film may be conformally formed on the semiconductor substrate 1000' to cover the sacrificial gate pattern 1200. Spacer patterns 1250 may be formed by etching part of the spacer film through an etching process. The spacer patterns 1250 may be formed on both sidewalls of the sacrificial gate pattern 1200 above the semiconductor substrate 1000'. The spacer patterns 1250 may each include an insulating material, e.g., silicon nitride, silicon carbide, silicon carbonitride, or silicon oxynitride. In an implementation, the spacer patterns 1250 may each include a low-dielectric material. The low-dielectric material may include hafnium oxide, hafnium silicate, zirconium oxide, or zirconium silicate.

Figure 7B:
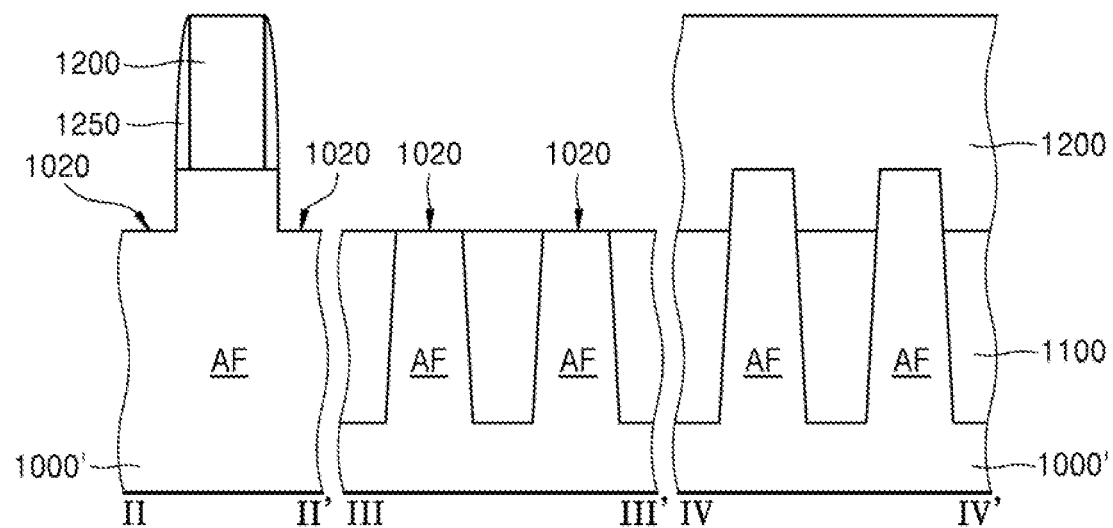

Referring to FIGS. 6 and 7B, a recess portion 1020 may be formed in the active pattern AF as the active pattern AF, which is exposed by the sacrificial gate pattern 1200, is partially etched. A bottom surface of the recess portion 1020 may be at a lower level than an uppermost surface of the active pattern AF. The recess portion 1020 may be formed in one side of the sacrificial gate pattern 1200.

Figure 7C:
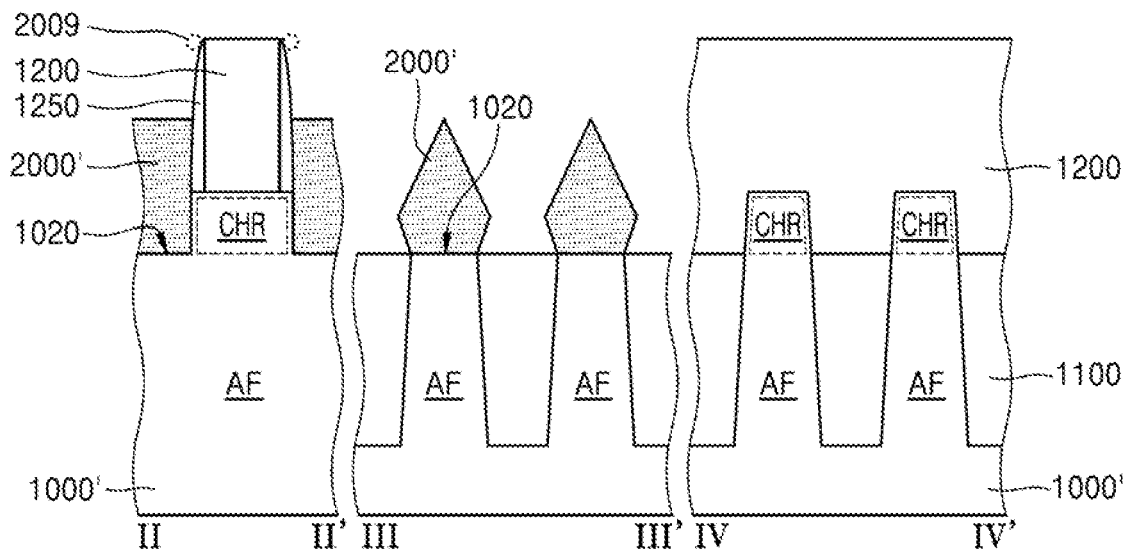

Referring to FIGS. 4B, 6, and 7C, a source/drain pattern 2000' may be formed on the active pattern AF on one side of the sacrificial gate pattern 1200 by using the deposition system 3. The source/drain pattern 2000' may be formed by growing an epitaxial pattern from the recess portion 1020 in the active pattern AF. The source/drain pattern 2000' may be formed by using a method similar to that described with regard to the silicon-containing film of FIG. 5.

In an implementation, after the semiconductor substrate 1000' is loaded on the substrate support 33 of the process chamber 30, a monochlorosilane MCS gas and the second source gas 201 may be provided to the process chamber 30, and accordingly, the source/drain pattern 2000' may be formed.

The source/drain pattern 2000' may include SiGe. As the source/drain pattern 2000' is formed, a channel region CHR may be formed in the active pattern AF under the sacrificial gate pattern 1200. The channel region CHR may be formed in the active pattern AF on one side of the source/drain pattern 2000'.

If a by-product gas (e.g., $SiH_4$) were to be excessively provided while the source/drain pattern 2000' is formed, a by-product pattern 2009 could be formed. The by-product gas may be formed according to the degradation of monochlorosilane MCS. The by-product pattern 2009 may be an epitaxial pattern formed on the spacer patterns 1250 as indicated by a dashed line. The formation of the by-product pattern 2009 may become defects or loss in the manufacturing process of the semiconductor device.

In an implementation, because monochlorosilane MCS having the high purity may be provided to the process chamber 30, the formation of the by-product pattern 2009 may be prevented/reduced. Accordingly, the productivity and the yield of the semiconductor device may be improved.

In an implementation, the source/drain pattern 2000' may be formed fast, depending on the use of monochlorosilane MCS. In an implementation, a formation rate of the source/drain pattern 2000' using monochlorosilane MCS may be faster than a formation rate of the source/drain pattern 2000' using $SiH_2Cl_2$. Therefore, the productivity of the semiconductor device may be enhanced.

The source/drain pattern 2000' may be selectively formed in the recess portion 1020. The formation process of the source/drain pattern 2000' by using monochlorosilane MCS may have a higher selectivity than a formation process of the source/drain pattern 2000' by using $SiH_2Cl_2$, and thus, sizes and shapes of the source/drain pattern 2000' may be easily adjusted.

Figure 7D:
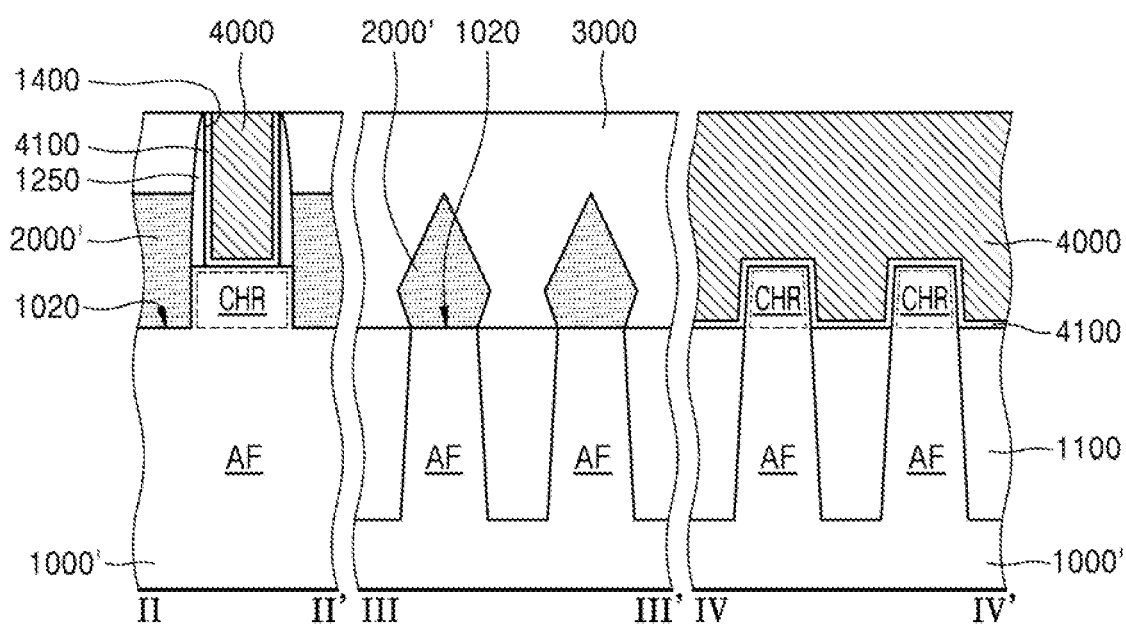

Referring to FIGS. 6 and 7D, an interlayer insulating layer 3000 may be formed to cover the source/drain pattern 2000'. The interlayer insulating layer 3000 may include silicon oxide, silicon nitride, silicon oxynitride, or a low-dielectric material. Then, an opening 1400 may be formed as the sacrificial gate pattern 1200 is removed. The opening 1400 may expose the channel regions CHR of the active pattern AF between the spacer patterns 1250.

The channel regions CHR of the active pattern AF may be covered as a gate insulating pattern 4100 is formed on the lower surface and sidewalls of the opening 1400. The gate insulating pattern 4100 may include, e.g., Si oxide, Si nitride, silicon nitride, silicon oxynitride, or a low-dielectric material.

A gate pattern 4000 may be formed on the gate insulating pattern 4100 in the opening 1400. The gate pattern 4000 may extend in the second direction D2 and may cross the active pattern AF. The gate pattern 4000 may be formed in the channel region CHR of the active pattern AF. The gate pattern 4000 may include layers. The gate pattern 4000 may include conductive metal nitride, transition metal (e.g., Ti, Ta, or the like), or a conductive material such as metal.

By way of summation and review, because of miniaturization and high integration of a semiconductor device, a quality of a material layer of the thin film process may be increased. Accordingly, research into thin film processes has continued.

One or more embodiments may provide a gas container for stably storing a source gas.

One or more embodiments may provide a silicon-containing film having improved productivity and a manufacturing method of a semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A deposition system, comprising:
  a process chamber;
  a gas supply outside of the process chamber, the gas supply being configured to provide gaseous monochlorosilane; and
  a gas supply pipe connecting the gas supply to the process chamber,
  wherein, the gas supply includes:
    a cabinet, and
    a gas container inside the cabinet, the gas container containing the gaseous monochlorosilane,
    wherein the gas container includes aluminum (Al),
    wherein a ratio of an amount of monochlorosilane to an internal volume of the gas container is 0.7 kg/L to 0.8 kg/L,
    wherein the gas container comprises:
      an external container,
      a first aluminum oxide layer on an internal surface of the external container, and
      a first passivation layer comprising monochlorosilane on an internal surface of the first aluminum oxide layer, the first passivation layer formed by rolling the gas container after monochlorosilane is provided in the gas container, and
  wherein the gas supply pipe includes:
    an aluminum layer,
    a second aluminum oxide layer covering an internal surface of the aluminum layer, and a second passivation layer comprising monochlorosilane on an internal surface of the second aluminum oxide layer.

2. The deposition system of claim 1, wherein the gas container includes Al in an amount of 89 wt % to 100 wt %, based on a total weight of metals of the gas container.

3. The deposition system of claim 2, wherein the gas container includes Al in an amount of 96 wt % to 100 wt %, based on the total weight of metals of the gas container.

4. The deposition system of claim 1, wherein a composition of the gas supply pipe is substantially the same as a composition of the gas container.

5. The deposition system of claim 1, wherein the gas supply pipe includes Al in an amount of 89 wt % to 100 wt %, based on a total weight of metals of the gas supply pipe.

6. The deposition system of claim 5, wherein the gas supply pipe includes Al in an amount of 96 wt % to 100 wt %, based on the total weight of metals of the gas supply pipe.

7. The deposition system as claimed in claim 1, further comprising a temperature adjuster configured to adjust an internal temperature of the gas container to be in a range between −45° C. and 30° C.

8. A deposition system, comprising:
a process chamber;
a gas supply outside the process chamber, the gas supply being configured to provide gaseous monochlorosilane; and
a gas supply pipe connecting the gas supply to the process chamber,
wherein the gas supply includes:
a cabinet, and
a gas container inside the cabinet, the gas container containing the gaseous monochlorosilane,
wherein the gas container includes aluminum (Al),
wherein a roughness of an internal surface of the gas container is 10 nm to 1 μm,
wherein a ratio of an amount of monochlorosilane to an internal volume of the gas container is 0.7 kg/L to 0.8 kg/L, and
wherein the gas container comprises an external container and as first aluminum oxide layer on an internal surface of the external container, and
wherein the gas container further comprises a first passivation layer comprising monochlorosilane on an internal surface of the first aluminum oxide layer, the first passivation layer formed by rolling the gas container after monochlorosilane is provided in the gas container, and
wherein the gas supply pipe includes:
an aluminum layer,
a second aluminum oxide layer covering an internal surface of the aluminum layer, and
a second passivation layer comprising monochlorosilane on an internal surface of the second aluminum oxide layer.

9. The deposition system of claim 8, wherein the gas container includes Al in an amount of 89 wt % to 100 wt %, based on a total weight of metals of the gas container.

10. The deposition system of claim 9, wherein the gas container includes Al in an amount of 96 wt % to 100 wt %, based on the total weight of metals of the gas container.

11. The deposition system of claim 1, wherein the first passivation layer comprises liquid monochlorosilane.

* * * * *